United States Patent
Chan et al.

(10) Patent No.: US 11,923,295 B2
(45) Date of Patent: Mar. 5, 2024

(54) INTERCONNECT LEVEL WITH HIGH RESISTANCE LAYER AND METHOD OF FORMING THE SAME

(71) Applicant: Taiwan Semiconductor Manufacturing Co., Ltd., Hsinchu (TW)

(72) Inventors: Hong-Wei Chan, Hsinchu (TW); Yung-Shih Cheng, Hsinchu (TW); Wen-Sheh Huang, Hsinchu (TW); Yu-Hsiang Chen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 82 days.

(21) Appl. No.: 16/906,659

(22) Filed: Jun. 19, 2020

(65) Prior Publication Data

US 2021/0257295 A1 Aug. 19, 2021

Related U.S. Application Data

(60) Provisional application No. 62/978,557, filed on Feb. 19, 2020.

(51) Int. Cl.
*H01L 23/522* (2006.01)
*H01L 21/768* (2006.01)

(52) U.S. Cl.
CPC .... *H01L 23/5228* (2013.01); *H01L 21/76846* (2013.01); *H01L 21/76877* (2013.01); *H01L 23/5226* (2013.01)

(58) Field of Classification Search
CPC .......... H01L 23/5228; H01L 21/76877; H01L 23/5226; H01L 27/0802; H01L 27/101
See application file for complete search history.

(56) References Cited

U.S. PATENT DOCUMENTS

| 6,090,709 A | 7/2000 | Kaloyeros et al. | |
| 6,194,775 B1* | 2/2001 | Usami | H01L 21/3185 |
| | | | 257/E27.101 |
| 6,465,348 B1 | 10/2002 | Wang | |
| 6,703,666 B1* | 3/2004 | Huttemann | H01C 17/08 |
| | | | 257/E27.047 |
| 7,528,048 B2* | 5/2009 | Coolbaugh | H01L 23/5228 |
| | | | 438/21 |
| 9,399,812 B2 | 7/2016 | Bodke et al. | |

(Continued)

FOREIGN PATENT DOCUMENTS

| CN | 109427655 A | 3/2019 |
| CN | 110085586 A | 8/2019 |

(Continued)

*Primary Examiner* — Phat X Cao
(74) *Attorney, Agent, or Firm* — Slater Matsil, LLP

(57) ABSTRACT

A semiconductor structure includes a first dielectric layer over a first conductive line and a second conductive line, a high resistance layer over a portion of the first dielectric layer, a second dielectric layer on the high resistance layer, a low-k dielectric layer over the second dielectric layer, a first conductive via extending through the low-k dielectric layer and the second dielectric layer, and a second conductive via extending through the low-k dielectric layer and the first dielectric layer to the first conductive line. The first conductive via extends into the high resistance layer.

20 Claims, 17 Drawing Sheets

(56) References Cited

U.S. PATENT DOCUMENTS

| | | |
|---|---|---|
| 9,583,345 B2 | 2/2017 | Chen et al. |
| 2006/0030151 A1 | 2/2006 | Ding et al. |
| 2008/0237800 A1* | 10/2008 | Chinthakindi .... H01L 21/76895 |
| | | 257/E29.001 |
| 2009/0242385 A1 | 10/2009 | Robison et al. |
| 2012/0115303 A1 | 5/2012 | Gambino et al. |
| 2012/0129337 A1* | 5/2012 | Chen ................. H01L 21/76813 |
| | | 257/E21.579 |
| 2016/0079057 A1 | 3/2016 | Varadarajan et al. |
| 2018/0190754 A1* | 7/2018 | Lin .................... H01L 21/32051 |
| 2018/0211952 A1* | 7/2018 | Shin .................... H01L 27/0629 |
| 2019/0067194 A1 | 2/2019 | Yu et al. |
| 2019/0229062 A1* | 7/2019 | Shin ................. H01L 23/53295 |
| 2019/0287851 A1 | 9/2019 | Chen et al. |
| 2019/0304833 A1 | 10/2019 | Chen et al. |
| 2020/0006334 A1 | 1/2020 | Hsueh et al. |

FOREIGN PATENT DOCUMENTS

| | | |
|---|---|---|
| CN | 110277347 A | 9/2019 |
| CN | 110323205 A | 10/2019 |
| CN | 110660743 A | 1/2020 |
| TW | 200620544 A | 6/2006 |
| TW | 200913139 A | 3/2009 |

* cited by examiner

INTERCONNECT LEVEL WITH HIGH RESISTANCE LAYER AND METHOD OF FORMING THE SAME

CROSS-REFERENCE TO RELATED APPLICATIONS

This application claims the benefit of U.S. Provisional Application No. 62/978,557, filed on Feb. 19, 2020, which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
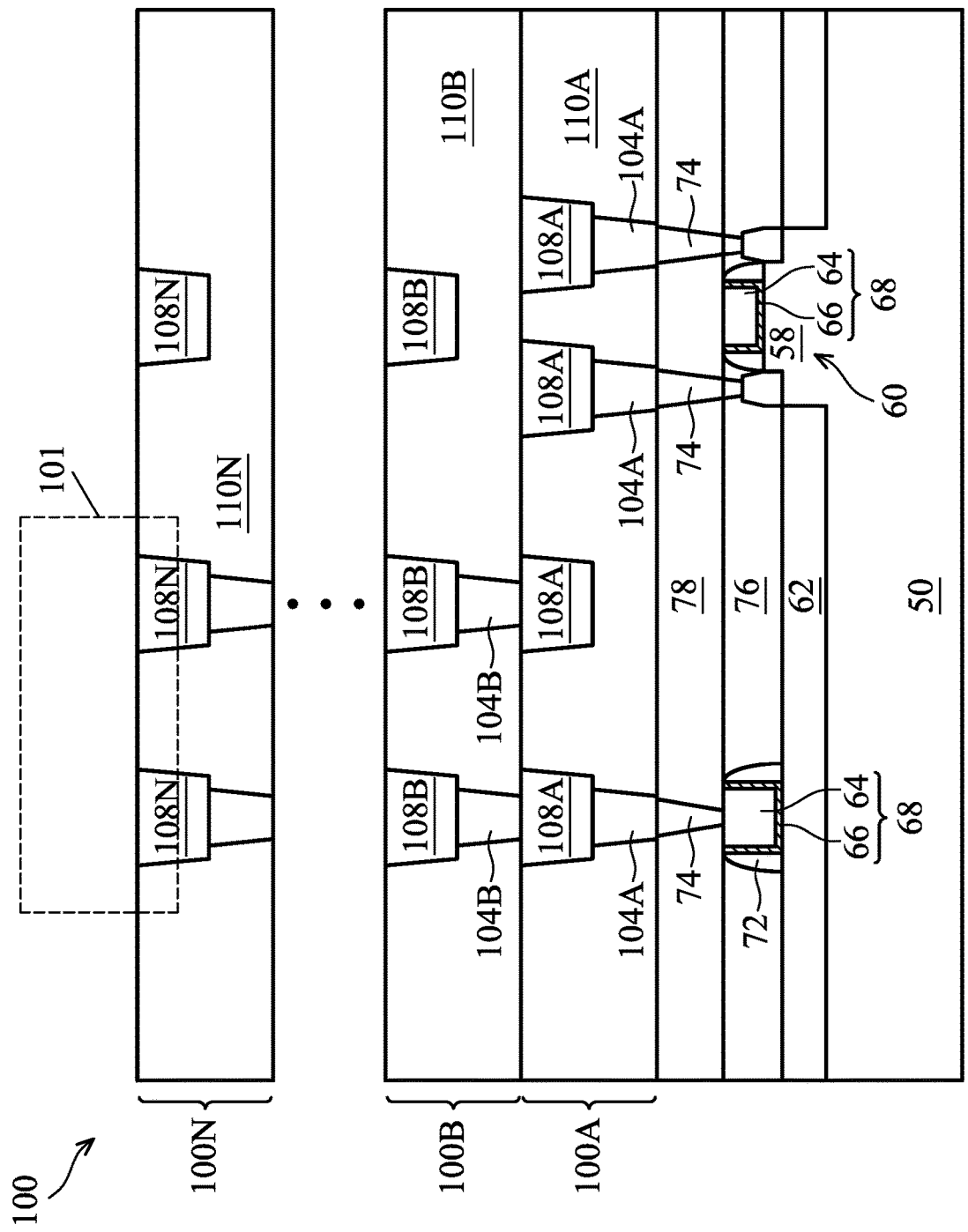
FIG. 1 illustrates a cross-sectional view of a semiconductor substrate and multilevel interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure includes, for example, high resistance layers between metallization layers in a Back End Of the Line (BEOL) area over a semiconductor device and methods of forming thereof. Placing the high resistance layer in the BEOL area between metallization layers may save, for example, up to 5% of an analog circuit design area over designs wherein the high resistance layer is below the metallization layers, such as in the Middle End Of Line (MEOL) or Front End Of Line (FEOL) area, and occupies around 5% of the analog die area. Uniform contact resistance for conductive vias may be produced by using dielectric layers of substantially similar thicknesses and materials as etch stops above conductive lines and high resistance layers to control the bottom surface areas of conductive vias to be substantially similar. This uniformity in conductive via contact resistance may be useful for device performance. While the present disclosure discusses aspects of methods of forming a high resistance layer in the context of a BEOL process performed after, e.g., a FinFET formation process, other embodiments may utilize aspects of this disclosure with other semiconductor fabrication processes.

FIG. 1 illustrates a cross-sectional view of a semiconductor structure 100 comprising a semiconductor substrate 50 in which various electronic devices may be formed, and a portion of a multilevel interconnect system (e.g., layers 100A and 100B) formed over the substrate 50, in accordance with some embodiments. Generally, as will be discussed in greater detail below, FIG. 1 illustrates a FinFET device 60 formed on a substrate 50, with multiple interconnection layers formed thereover.

Generally, the substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, MN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1 is a three-dimensional MOSFET structure formed in fin-like strips of semiconductor protrusions 58 referred to as fins. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner (not shown) such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a gate-last process flow. In a gate last process flow a sacrificial dummy gate structure (not shown) is formed after forming the STI regions 62. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the high-k metal gate (HKMG) gate structure 68 as illustrated in FIG. 1. The HKMG gate structure 68 illustrated in the right side in FIG. 1 (seen on the top of fin 58) is an example of an active HKMG gate structure which extends, e.g., along sidewalls of and over the portion of fin 58 protruding above the STI region 62, and the HKMG gate structure 68 in the left side in FIG. 1 is an example gate structure extending over the STI region 62, such as between adjacent fins. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1) or the surface of the STI dielectric (as illustrated in the left side of FIG. 1).

Source and drain regions 54 are semiconductor regions in contact with the semiconductor fin 58. In some embodiments, the source and drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions 54 either in situ during SEG, or by an ion implantation process performed after the SEG, or by a combination thereof.

A first interlayer dielectric (ILD) layer 76 (seen in FIG. 1) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 76. The HKMG gate structures 68, illustrated in FIG. 1, may then be formed by first removing the dummy gate structures using one or more etching techniques, thereby creating recesses between respective spacers 72.

Next, a replacement gate dielectric layer 66 comprising one more dielectrics, followed by a replacement conductive gate layer 64 comprising one or more conductive materials, are deposited to completely fill the recesses. The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like. Excess portions of the gate structure layers 64 and 66 may be removed from over the top surface of first ILD layer 76 using, for example a CMP process. The resulting structure, as illustrated in FIG. 1, may be a substantially coplanar surface comprising an exposed top surface of first ILD layer 76, spacers 72, and remaining portions of the HKMG gate layers 66 and 64 inlaid between respective spacers 72.

A second ILD layer 78 may be deposited over the first ILD layer 76, as illustrated in FIG. 1. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, physical vapor deposition (PVD), ALD, PEALD, PECVD, SACVD, FCVD, spin-on, and/or the like, or a combination thereof.

As illustrated in FIG. 1, electrodes of electronic devices formed in the substrate 50 may be electrically connected to conductive features of a first interconnect level 100A using conductive connectors (e.g., contacts 74) formed through the intervening dielectric layers. In the example illustrated in FIG. 1, the contacts 74 make electrical connections to the source and drain regions 54 of FinFET 60. Contacts 74 to gate electrodes are typically formed over STI regions 62. A separate gate electrode 64 (shown in the left in FIG. 1) illustrates such contacts. The contacts may be formed using photolithography techniques. For example, a patterned mask may be formed over the second ILD layer 78 and used to etch openings that extend through the second ILD layer 78 to expose a portion of gate electrodes over STI regions 62, as well as etch openings over the fins 58 that extend further, through the first ILD layer 76 and the CESL (not shown) liner below first ILD layer 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the gate electrodes 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL In some embodiments, a conductive liner may be formed in the openings in the first ILD layer 76 and the second ILD layer 78. Subsequently, the openings are filled with a conductive fill material. The liner comprises barrier metals used to reduce out-diffusion of conductive materials from the contacts 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the second ILD layer 78. The resulting conductive plugs extend into the first and second ILD layers 76 and 78 and constitute contacts 74 making physical and electrical connections to the electrodes of electronic devices, such as the tri-gate FinFET 60 illustrated in FIG. 1. In this example, contacts to electrodes over STI region 62 and to electrodes over fins 58 are formed simultaneously using the same processing steps. However, in other embodiments these two types of contacts may be formed separately.

As illustrated in FIG. 1, multiple interconnect levels may be formed, stacked vertically above the contacts 74 formed in the first and second ILD layers 76 and 78, in accordance with a back end of line (BEOL) scheme adopted for the integrated circuit design. In the BEOL scheme illustrated in FIG. 1, various interconnect levels have similar features. However, it is understood that other embodiments may utilize alternate integration schemes wherein the various interconnect levels may use different features. For example, the contacts 74, which are shown as vertical connectors, may be extended to form conductive lines which transport current laterally.

The interconnect levels (e.g., interconnect levels 100A-100N) comprise conductive vias and lines embedded in an intermetal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In the BEOL scheme illustrated in FIG. 1, conductive vias 104A connect contacts 74 to conductive lines 108A and, at subsequent levels, vias connect lines on a level below the vias to lines above the vias (e.g., a pair of lines 108A and 108B can be connected by via 104B). Other embodiments may adopt a different scheme. For example, vias 104A may be omitted from the 100A level and the contacts 74 may be configured to be directly connected to lines 108A.

Still referring to FIG. 1, the first interconnect level 100A may be formed using, for example, a dual damascene process flow. First, a dielectric stack used to form IMD layer 110A may be deposited using one or more layers of the dielectric materials listed in the description of the first and second ILD layers 76 and 78. In some embodiments, IMD layer 110A includes an etch stop layer (not shown) positioned at the bottom of the dielectric stack. The etch stop layer comprises one or more insulator layers (e.g., SiN, SiC, SiCN, SiCO, CN, combinations thereof, or the like) having an etch rate different than an etch rate of an overlying material. The techniques used to deposit the dielectric stack for IMD may be the same as those used in forming the first and second ILD layers 76 and 78.

Appropriate photolithography and etching techniques (e.g., anisotropic RIE employing fluorocarbon chemicals) may be used to pattern the IMD layer 110A to form openings for vias and lines. The openings for vias may be vertical holes extending through IMD layer 110A to expose a top conductive surface of contacts 74, and openings for lines may be longitudinal trenches formed in an upper portion of the IMD layer. In some embodiments, the method used to pattern holes and trenches in IMD layer 110A utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of IMD layer 110A and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the holes and trenches forming the conductive vias 104A and lines 108A of the first interconnect level 100A. The openings may be first lined with a conductive diffusion barrier material and then completely filled with a conductive fill material deposited over the conductive diffusion barrier liner. In some embodiments, a thin conductive seed layer may be deposited over the conductive diffusion barrier liner to help initiate an ECP deposition step that completely fills the openings with a conductive fill material.

The diffusion barrier conductive liner in the vias 104A and lines 108A may comprise one or more layers of TaN, Ta, TiN, Ti, Co, or the like, or combinations thereof. The conductive fill layer in vias 104A and lines 108A may comprise metals such as Cu, Al, W, Co, Ru, or the like, or combinations thereof, or multi-layers thereof. The conductive materials used in forming the conductive vias 104A and lines 108A may be deposited by any suitable method, for example, CVD, PECVD, PVD, ALD, PEALD, electrochemical plating (ECP), electroless plating and the like. In some embodiments, the conductive seed layer may be of the same conductive material as the conductive fill layer and deposited using a suitable deposition technique (e.g., CVD, PECVD, ALD, PEALD, or PVD, or the like).

Any excess conductive material over the IMD layer 110A outside of the openings may be removed by a planarizing process (e.g., CMP) thereby forming a top surface comprising dielectric regions of IMD layer 110A that are substantially coplanar with conductive regions of lines 108A. The planarization step completes fabrication of the first interconnect level 100A comprising conductive vias 104A and conductive lines 108A embedded in IMD layer 110A, as illustrated in FIG. 1.

The interconnect level positioned vertically above the first interconnect level 100A in FIG. 1 is the second interconnect level 100B. In some embodiments, the structures of the various interconnect levels (e.g., the first interconnect level 100A and the second interconnect level 100B) may be similar. In the example illustrated in FIG. 1, the second interconnect level 100B comprises conductive vias 104B and conductive lines 108B embedded in an insulating film IMD 110B having a planar top surface. The materials and processing techniques described above in the context of the first interconnect level 100A may be used to form the second interconnect level 100B and subsequent interconnect levels.

Subsequent interconnect levels may be formed above the first and second interconnect levels 100A and 100B, up to an $N^{th}$ interconnect level 100N. In this example, the $N^{th}$ interconnect level 100N may be formed using the same materials and methods used to form the first and second interconnect levels 100A and 100B. The ellipsis in FIG. 1 indicates one or more additional interconnect levels that may be used to electrically connect between the second interconnect level 100B and the $N^{th}$ interconnect level 100N.

The example electronic device (FinFET 60) and example interconnect structures making connections to the electronic device are provided for illustrative purposes only to further explain applications of the present invention, and are not meant to limit the present invention in any manner.

Figure 2:
FIGS. 2 through 10B illustrate cross-sectional and plan views of a semiconductor device at various intermediate stages of fabrication, in accordance with some embodiments.

FIG. 2 illustrates a detailed cross-sectional view of region 101 of FIG. 1, showing a top portion of the $N^{th}$ interconnect level 100N. In FIG. 2, the $N^{th}$ interconnect level 100N has been illustrated as the interconnect level over which a high resistance layer is formed as discussed in greater detail below, in accordance with some embodiments. The conductive lines 108N and the IMD 110N are shown for illustrative purposes only; it is understood that the conductive lines 108N and the IMD 110N may be placed at any metallization layer suitable in a particular design, such as e.g. the fifth metallization layer.

Figure 3:
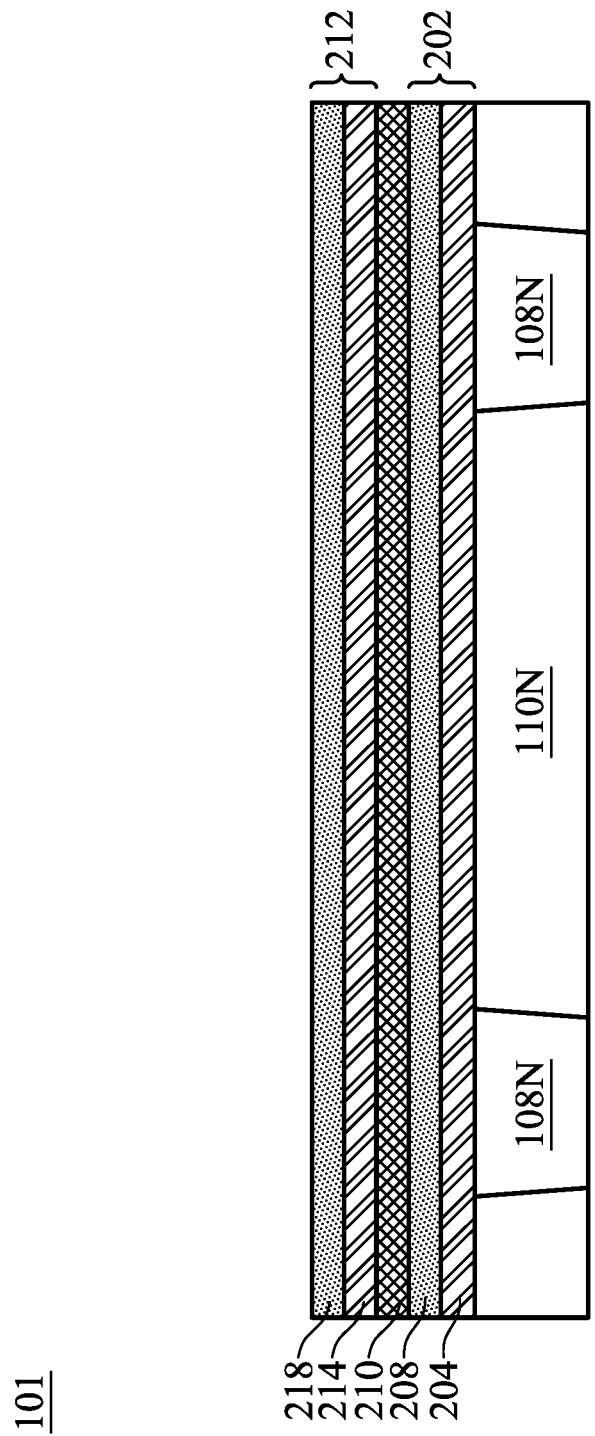

FIG. 3 illustrates a first dielectric layer 202 comprising a first silicidation blocking layer (SBL) 204 and a first dielectric sublayer 208, a high resistance layer 210, and a second dielectric layer 212 comprising a second SBL 214 and a second dielectric sublayer 218 over the conductive lines 108N and the IMD 110N. The first and second silicidation blocking layers (SBLs) 204 and 214 may be formed to reduce formation of excess silicide during the subsequent formation of conductive contacts, which may be useful in reducing leakage current through a path provided by the excess silicide, improving device performance, and acting as etch stop layers. The first SBL 204 comprises SiC, SiN, oxynitride, SiON, SiCN, SiOCN, SiOC, oxide, a combination thereof, or the like and may be formed on the conductive lines 108N and the IMD 110N by methods utilized to form such a layer, such as chemical vapor deposition (CVD), plasma enhanced CVD (PECVD), sputter, and other methods known in the art. The first SBL 204 may be formed to a thickness in a range of about 80 Å to about 150 Å.

The first and second dielectric sublayers 208 and 218 may be formed as etch stops for subsequent etch processes, e.g. in order to form contacts to the conductive lines 108N and/or the high resistance layer 210. The first dielectric sublayer 208 and the second dielectric sublayer 218 comprise a dielectric material with an etch selectivity to material of a subsequently formed dielectric layer (e.g., the low-k dielectric layer 124 referenced below with reference to FIG. 5A), such that an etch process may be used in which the material of the subsequently formed low-k dielectric layer 124 is etched at a faster rate than the materials of the first dielectric sublayer 208 and the second dielectric sublayer 218. In some embodiments, the first dielectric sublayer 208 and the second dielectric sublayer 218 may be formed using a precursor such as tetraethyl orthosilicate (TEOS) or the like by methods utilized to form such a layer, such as chemical vapor deposition (CVD), plasma enhanced CVD, sputter, and other methods known in the art. The first dielectric sublayer 208 may be formed to a thickness in a range of about 150 Å to about 250 Å.

Further referring to FIG. 3, the high resistance layer 210 comprises TaN or TiN, a combination thereof, or the like and may be formed on the first dielectric sublayer 208 by methods such as CVD, PECVD, PVD, or the like. The high resistance layer 210 may be formed to a thickness in a range of about 30 Å to about 60 Å. As discussed below, the high resistance layer 210 will be patterned to form a resistor (e.g. a high resistance path) in a circuit. The high resistance layer 210 being formed in the BEOL area between metallization layers may save, for example, up to 5% of an analog circuit design area over designs wherein the resistor is below the metallization layers, such as in the MEOL or FEOL area, and occupies around 5% of the analog die area. The second SBL 214 comprises similar materials as the first SBL 204 and may be formed on the high resistance layer 210 by similar methods as the first SBL 204 described above. The second SBL 214 may be formed to a thickness in a range of about 80 Å to about 150 Å. The second dielectric sublayer 218 comprises similar materials as the first dielectric sublayer 208 and may be formed on the high resistance layer 210 by similar methods as the first dielectric sublayer 208 described above. The second dielectric sublayer 218 may be formed to a thickness in a range of about 200 Å to about 400 Å.

Figure 4A:
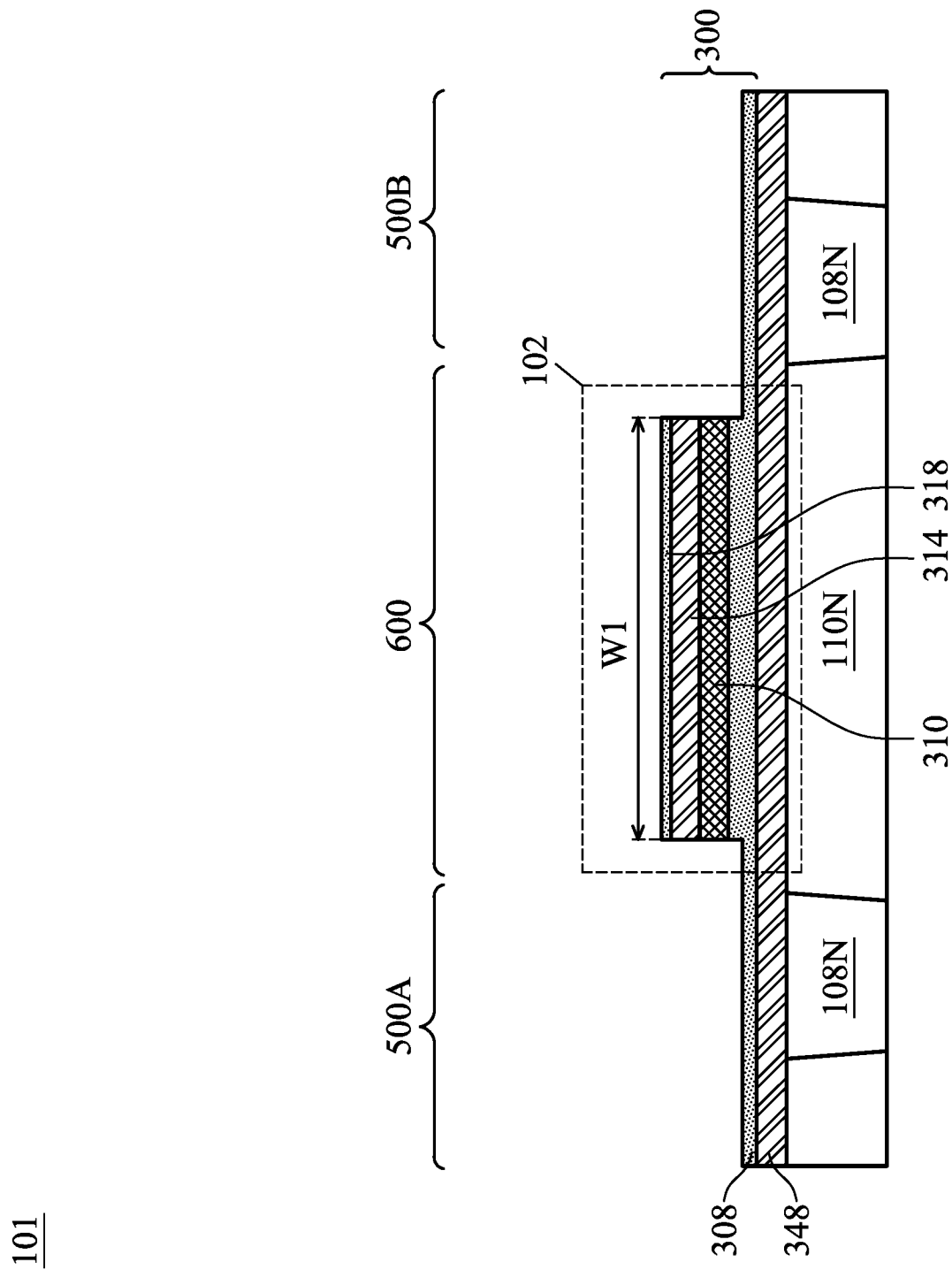

FIG. 4A, following from FIG. 3, illustrates patterned layers 300, comprising a patterned first dielectric sublayer 308, a patterned high resistance layer 310, a patterned second SBL 314, and a patterned second dielectric sublayer 318, on the first SBL 204 in logic areas 500A/500B and a high resistance area 600. In the logic areas 500A and 500B, which may be used for the fabrication of, e.g., metal lines, the patterning process may remove the high resistance layer 210, the second SBL 214, and the second dielectric sublayer 218. The high resistance area 600 may be used for the fabrication of, e.g., transistors. The patterned high resistance layer 310, the patterned second SBL 314, and the patterned second dielectric sublayer 318 may remain after the patterning process. The patterned layers 300 may have a width W1 in a range of about 1000 Å to about 20000 Å measured between opposite sidewalls of the patterned second dielectric sublayer 318. The logic areas 500A/500B are illustrated as being immediately adjacent to and on opposing sides of the high resistance area 600 for illustrative purposes. In some embodiments, the high resistance area 600 may be spaced apart from the illustrated logic areas 500A/500B.

In some embodiments, the patterned layers 300 are patterned with a photolithography and etching process. For example, the photolithography and etching process may include forming and patterning a photoresist layer is formed and patterned on the second dielectric sublayer 218, optionally using one or more masking layers. The photoresist may be formed by spin coating or the like and may be exposed to light for patterning. The pattern of the photoresist corresponds to the patterned layers 300. One or more exposure steps may be applied to the photoresist to define the patterned layers 300. After the one or more exposures, the photoresist is developed to form openings through the photoresist to expose portions of an underlying layer, such as the second dielectric sublayer 218 or a masking layer. Then, the photoresist is removed by an acceptable ashing or stripping process, such as using an oxygen plasma or the like. Once the photoresist is removed, exposed portions of the first dielectric sublayer 208, the high resistance layer 210, the second SBL 214, and the second dielectric sublayer 218 are removed, such as by using one or more etching process, such as by wet or dry etching with a two step etch process. In a first etching step, the second SBL 214 and the dielectric sublayer 218 are etched, for example, for a duration in a range of about 20 seconds to about 40 seconds stopping on the high resistance layer 210. Then, in a second etching step, the high resistance layer 210 is etched for a duration in a range of about 20 seconds to about 40 seconds stopping on the first dielectric sublayer 208. In some embodiments, portions of the first dielectric sublayer 208 are recessed during the second etching step.

The etching may be followed by an acceptable stripping process, such as a wet stripping using NaOH and/or a cleaning process using HF, to remove remaining photoresist/masking materials and residues of the etched portions of the first dielectric sublayer 208, the high resistance layer 210, the second SBL 214, and the second dielectric sublayer 218. The remaining portions of the first dielectric sublayer 208, the high resistance layer 210, the second SBL 214, and the second dielectric sublayer 218 form the patterned layers 300.

Figure 4B:
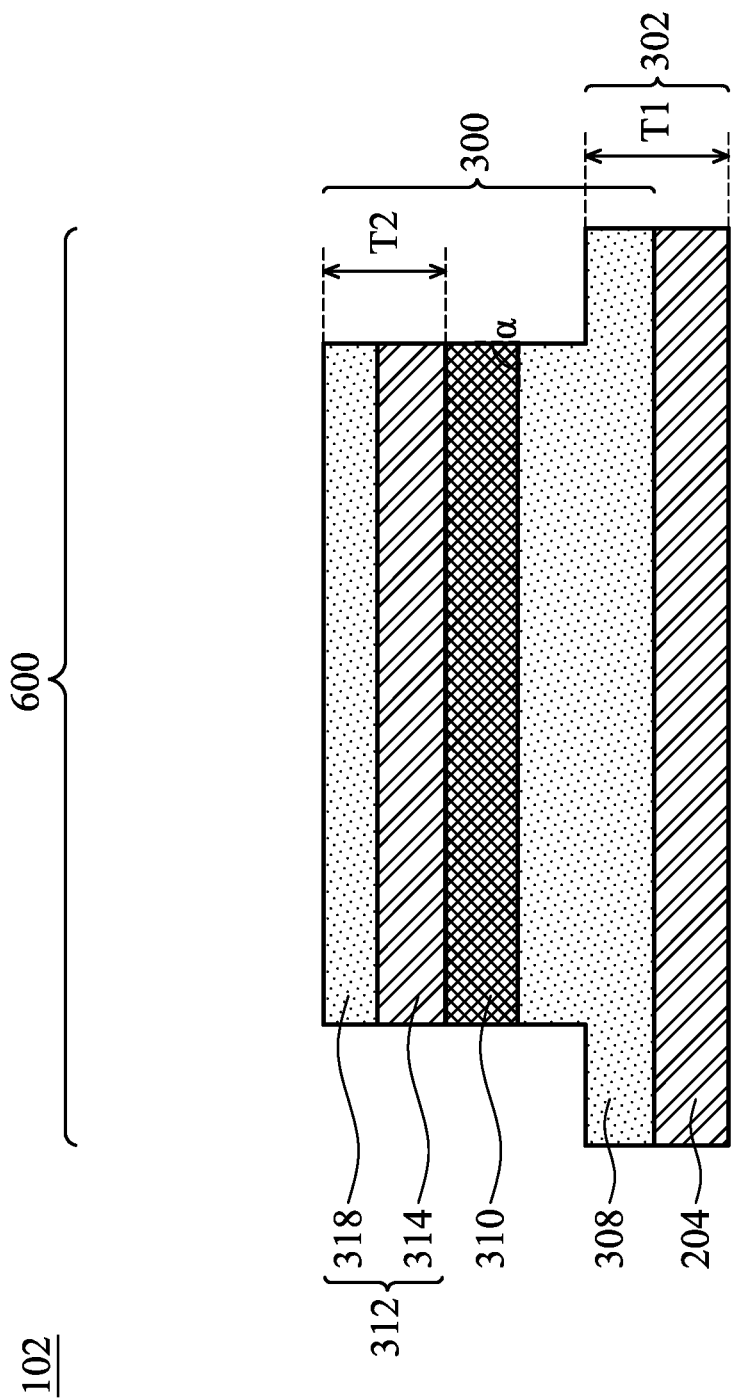

FIG. 4B illustrates a detailed view of region 101 of FIG. 4A showing the high resistance area 600. The patterned second dielectric sublayer 318 may have a thickness in a range of about 80 Å to about 150 Å. The thickness of the patterned second dielectric sublayer 318 may be reduced from the original thickness of the second dielectric sublayer 218 by the patterning process used to form the patterned layers 300, e.g. the etching process described above with respect to FIG. 4A. The patterned second SBL 314 and the patterned high resistance layer 310 may have substantially similar thicknesses as the second SBL 214 and the high resistance layer 210 described above with respect to FIG. 3, prior to the patterning process. Portions of the patterned first dielectric sublayer 308 not covered by the patterned high resistance layer 310 may be recessed to a thickness in a range of about 80 Å to about 120 Å. Portions of the patterned first dielectric sublayer 308 covered by the patterned high resistance layer 310 may retain their original thickness in a range of about 150 Å to about 250 Å.

A patterned first dielectric layer 302 comprising the first SBL 204 and the portion of the patterned first dielectric sublayer 308 not covered by the patterned high resistance layer 310 may have a thickness T1 in a range of about 150 Å to about 250 Å. A patterned second dielectric layer 312 comprising the patterned second SBL 314 and the patterned second dielectric sublayer 318 may have a thickness T2 in a range of about 150 Å to about 250 Å. A ratio of the thickness T1 to the thickness T2 may be in a range of about 1:1. The thickness T1 being about the same as the thickness T2, as well as being formed of same or similar materials, may allow openings to be simultaneously formed through a low-k dielectric layer subsequently formed over the patterned first dielectric layer 302 and the patterned second dielectric layer 312, which may be useful for forming conductive vias with substantially similar bottom surface areas and uniformity in contact resistance.

A sidewall of the patterned high resistance layer 310 forms an angle α with a bottom surface of the patterned high resistance layer 310 that may be in a range of about 70° to about 90°, or in a range of about 87° to about 90°, such as about 90°. The angle α being in a range of about 70° to about 90° may provide better uniformity of the patterned high resistance layer 310. The angle α being less than about 70° may induce worse uniformity in the patterned high resistance layer 310. The angle α being greater than about 90° may induce etch residue which may underlie the patterned high resistance layer 310.

Figure 5A:
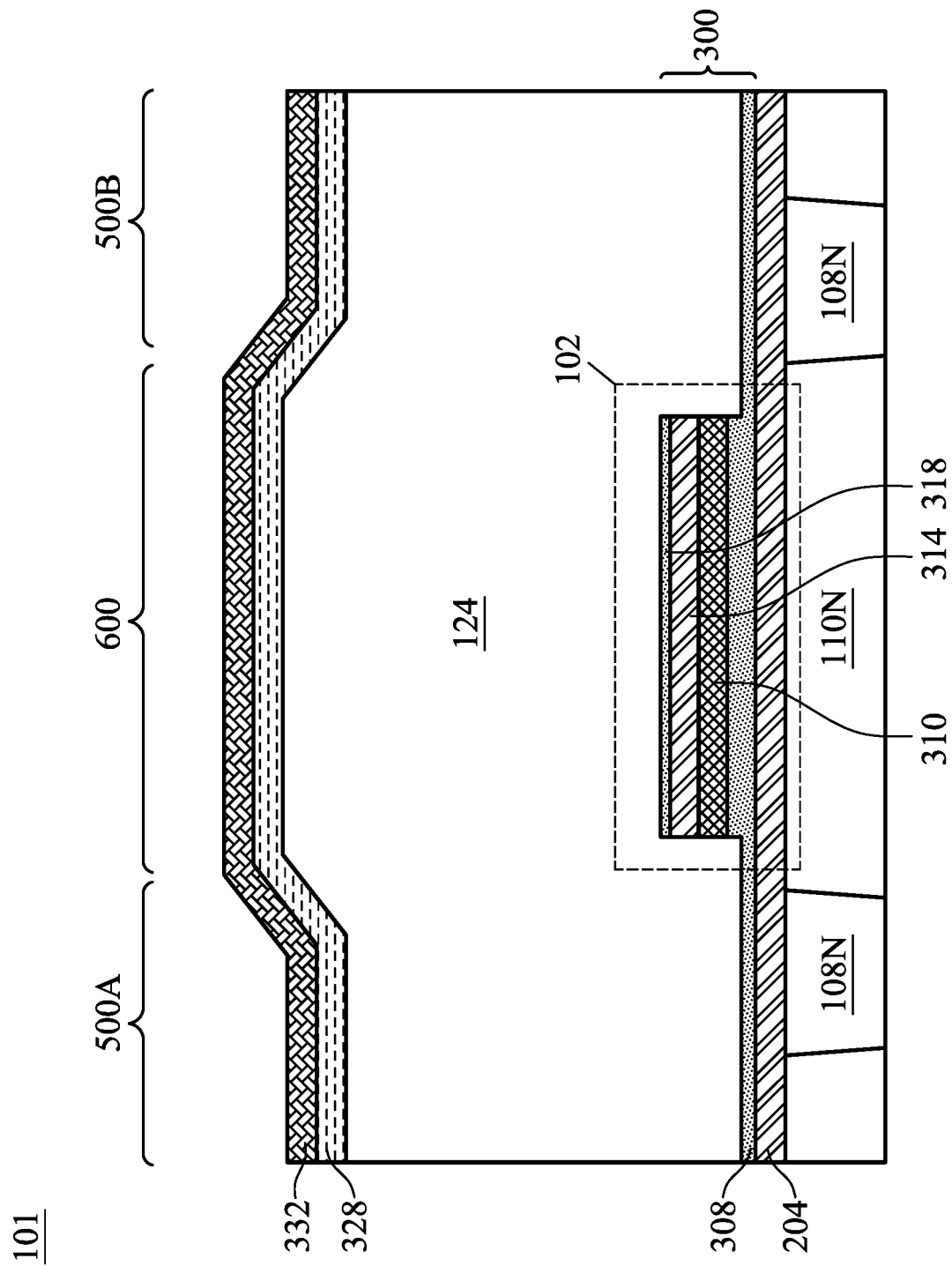
Figure 5B:
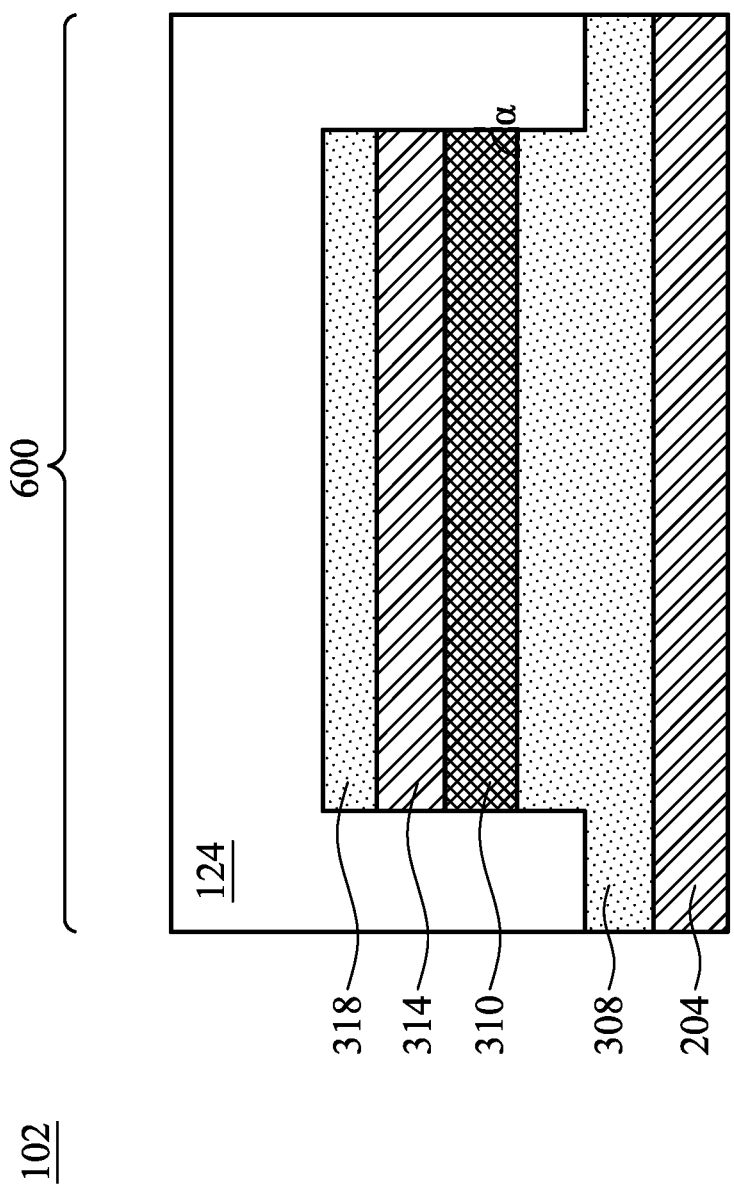

FIGS. 5A and 5B follow from FIGS. 4A and 4B, respectively, illustrating a low-k dielectric layer 124 formed over the patterned layers 300. The low-k dielectric layer 124 may be an extreme low-k (ELK) dielectric layer. For example, the low-k dielectric layer 124 can have a k-value in a range from about 2.4 to about 3.2. In some examples, the low-k dielectric layer 124 is or includes silicon, carbon, fluorine, oxygen, the like, or a combination thereof. The low-k dielectric layer 124 can be deposited using CVD, PECVD, ALD, PEALD, PVD, spin-on and/or the like, or a combination thereof. A thickness of the low-k dielectric layer 124 can be in a range from about 1310 Å to about 1510 Å.

FIG. 5A further illustrates a mask over the low-k dielectric layer 124. In some embodiments, the mask comprises a bottom mask 328 and a top mask 332. The bottom mask 328 may be an anti-reflective coating (ARC) overlying the low-k dielectric layer 124. Anti-reflective coatings improve photo resolution by reducing optical distortions associated with specular reflections, thin-film interference, and/or standing waves that may inhibit sharp feature definition during imaging of photoresist material. In the illustrated example, the bottom mask or ARC 328 may comprise a nitrogen-free ARC (NFARC) (e.g., an organic ARC, such as $C_xH_xO_x$, or inorganic ARC, such as SiC) to further improve feature definition during patterning of a subsequently formed photoresist layer. In some embodiments, the bottom mask 328 may have a thickness in a range of about 290 Å to about 310 Å, such as about 300 Å. The bottom mask 328 may be formed by any suitable deposition technique, e.g., CVD, PECVD, ALD, PEALD, PVD, spin-on and/or the like, or a combination thereof.

Further referring to FIG. 5A, the top mask 332 may be a hard mask comprising a material such as TiN, TaN, the like, or a combination thereof. In some embodiments, the top mask 332 may have a thickness in a range of about 370 Å to about 390 Å. The top mask 332 may be formed by any suitable deposition technique, e.g., CVD, PECVD, ALD, PEALD, PVD, spin-on and/or the like, or a combination thereof.

In some embodiments, the bottom mask 328 and the top mask 332 are formed before a top surface of the low-k dielectric layer 124 is planarized by a process such as, e.g., a CMP. Forming the bottom mask 328 and the top mask 332 over the top surface of the low-k dielectric layer 124 before a planarization may be useful in the subsequent formation of via openings (see below, FIG. 6A) with substantially similar bottom profiles in the logic areas 500A and 500B and in the high resistance area 600. The thickness of the low-k dielectric layer 124 in the logic areas 500A and 500B will be substantially similar to the thickness of the low-k dielectric layer 124 in the high resistance area 60o when the via openings are subsequently formed due to the planarization being performed after the formation of the via openings.

Additionally, the materials over the patterned high resistance layer 310 and over the conductive lines 108N are similar and have similar thicknesses, thereby allowing openings to be formed through the low-k dielectric layer 124 to the conductive lines 108N and the patterned high resistance layer simultaneously while achieving via openings of substantially equal sizes. For example, as discussed above, the patterned second dielectric sublayer 318 over the patterned high resistance layer 310 has a similar thickness and formed of similar materials as the patterned first dielectric sublayer 308 over the conductive lines 108N. The first dielectric sublayer 208 was initially formed to be thicker than the second dielectric sublayer 218. The patterning process described above with reference to FIGS. 4A and 4B thins the first dielectric sublayer 208 more than the second dielectric sublayer 218, thereby resulting in the patterned first dielectric sublayer 308 over the conductive lines 108N having a substantially similar thickness as the patterned second dielectric sublayer 318 over the patterned high resistance layer 310. In some embodiments, a difference between a thickness of the patterned first dielectric sublayer 308 and a thickness of the patterned second dielectric sublayer 318 may be less than about 10 Å, and a ratio of a thickness of the patterned first dielectric sublayer 308 to a thickness of the patterned second dielectric sublayer 318 may be in a range from about 0.9 to about 1.1.

Figure 6A:
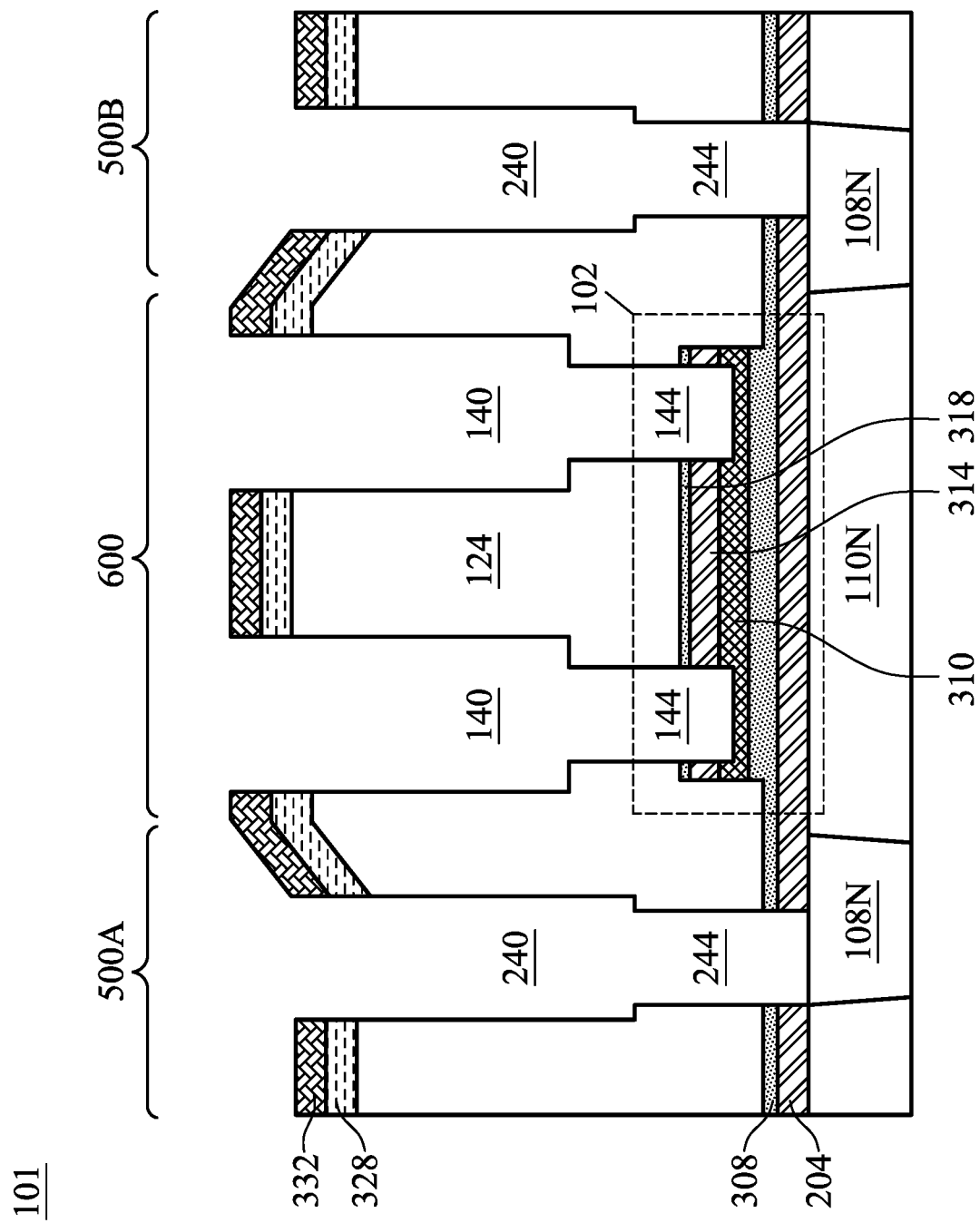

FIG. 6A illustrates trench openings 140 and 240 extending through the top mask 332, the bottom mask 328, and the low-k dielectric layer 124 in accordance with some embodiments. The terms "trench" and "via" used in the present disclosure may broadly cover any topographic features such as "opening," "holes," "recesses," "plugs," etc., that are suitable for providing a conductive or contact path which extend horizontally and/or vertically within the semiconductor device. The trench openings 140 may be formed in the high resistance area 600 overlying the patterned high resistance layer 310, and the trench openings 240 may be formed in the logic areas 500A and 500B over the conductive lines 108N. The low-k dielectric layer 124 may be patterned using a photoresist (not illustrated) over the top mask 332 as an etch mask to etch the trench openings 140 and 240. Any acceptable etching technique may be used, for example, RIE processes described earlier with reference to FIG. 1 used to form vias and lines such as the via 104B and the conductive line 108B.

The etching process may include one or more etching steps. For example, a first etch step may be performed using etchants to remove an exposed portion of the top mask 332 and the bottom mask 328, and a second etch step may be performed using etchants that remove portions of the low-k dielectric layer 124. In some embodiments, the first and second etch steps may be the same step.

Figure 6B:
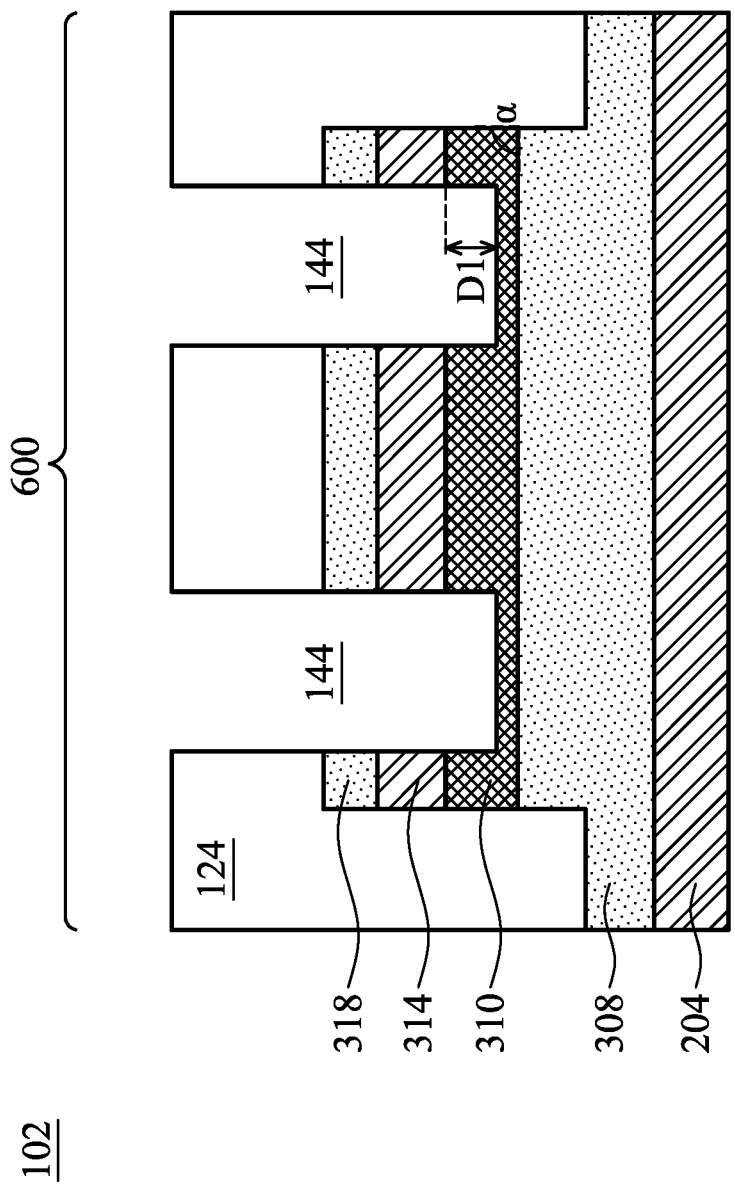

FIG. 6A further illustrates via openings 144 and 244 in bottom surfaces of trench openings 140 and 240, respectively. FIG. 6B illustrates a detailed view of region 102 of FIG. 6A, showing the via openings 144 in high resistance area 600. The via openings 144 and 244 can be formed in logic areas 500A and 500B and the high resistance area 600 using a patterned mask (e.g., a patterned photoresist layer and/or one or more patterned masking layers) that defines a via pattern that is substantially aligned with, but having a lateral width narrower than that of the trench pattern as a mask, followed by a suitable etching process. The via openings 144 extend through the patterned first dielectric sublayer 308 and the first SBL 204 into a top surface of the patterned high resistance layer 310, and the via openings 244 extend through the patterned first dielectric sublayer 308 and the first SBL 204 to a top surface of the conductive lines 108N. The via openings 144 and 244 may be formed with an etching process using etchant gas mixtures such as $CH_4$, $O_2$, $N_2$, the like, or a combination thereof and plasma power source power in a range of about 100 to about 500 watts. The via openings 244 may be formed using the patterned first dielectric sublayer 308 and the first SBL 204 as an etch stop, and the via openings 144 may be formed using the patterned second dielectric sublayer 318 and the patterned second SBL 314 as an etch stop, which may be useful for controlling the depth of subsequently formed conductive vias into the conductive lines 108N and the patterned high resistance layer 310, respectively. The etching process may be an etch with a duration in a range of about 30 seconds to about 50 seconds. In some embodiments, the via openings 144 and 244 are formed at the same time with the same etching process. The patterned mask is then removed using any suitable stripping process. It should be understood that while a trench first via last (TFVL) approach is discussed herein, the concept of the present disclosure is also applicable to via first trench last (VFTL) approach.

In some embodiments, the first SBL 204 in the logic areas 500A and 500B has substantially the same thickness as the patterned second SBL 314 in the high resistance area 600, the patterned first dielectric sublayer 308 in the logic areas 500A and 500B has substantially the same thickness as the patterned second dielectric sublayer 318 in the high resistance area 600, and the same etch process is performed to etch the via openings 144 and the via openings 244. The via openings 144 and the via openings 244 may be controlled to have substantially similar bottom surface areas by the use of similar materials, similar thicknesses and the same etch process. Because the via openings 144 and 244 are formed to have substantially similar bottom surface areas, conductive vias subsequently formed in the via openings 144 and 244 may have substantially similar resistances, which may be useful for uniformity in contact resistance and device performance.

The via openings 144 may extend into the patterned high resistance layer 310 by a depth D1 in a range of about 10 Å to about 40 Å, which may provide a subsequently formed conductive via with lower contact resistance leading to improved device performance. The depth D1 being less than about 10 Å may lead to a poor connection between a subsequently formed via and the patterned high resistance layer 310. The depth D1 being greater than about 40 Å may lead to the via openings 144 punching through the lower surface of the patterned high resistance layer 310, which may cause poor device function.

Figure 7A:
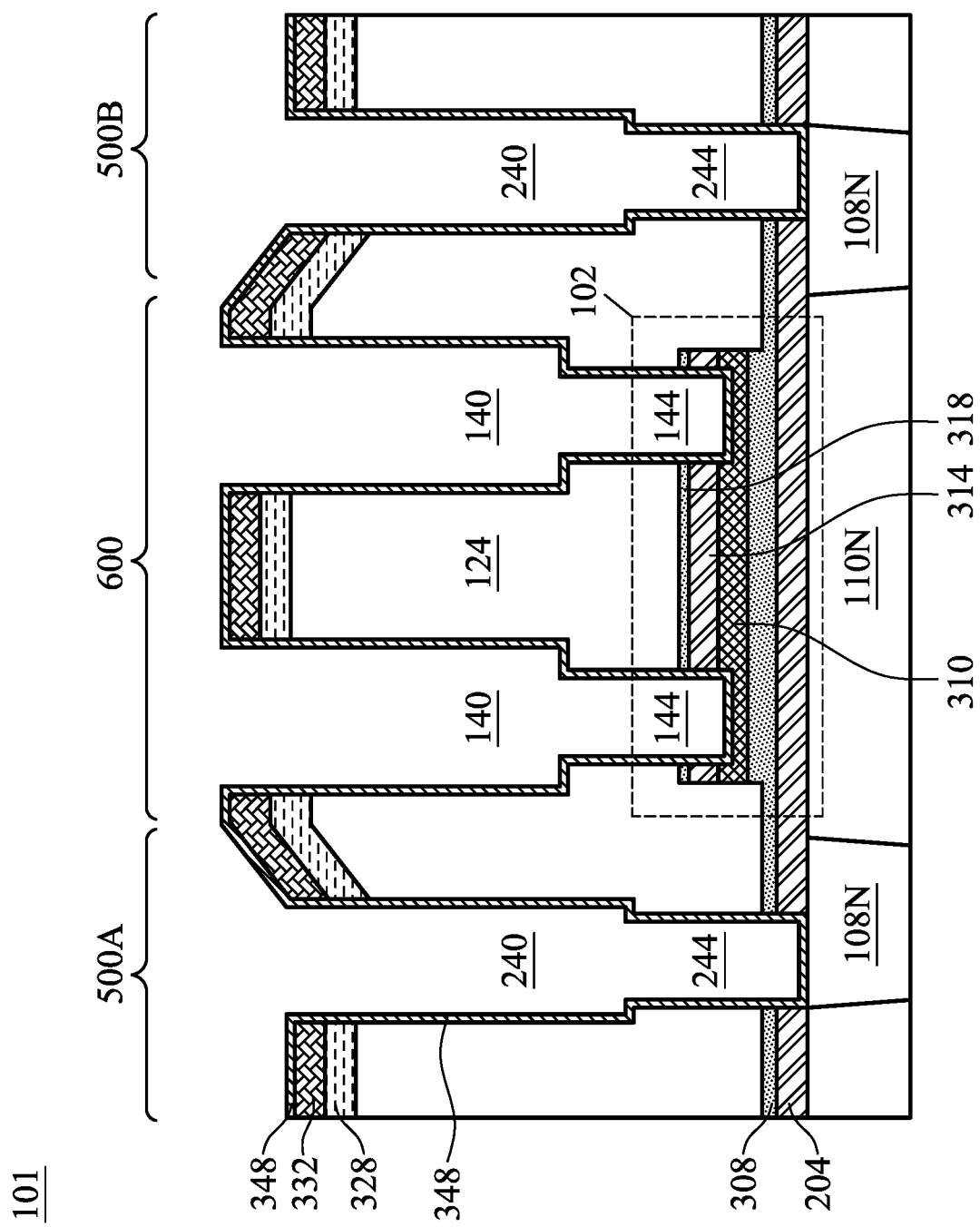
Figure 7B:
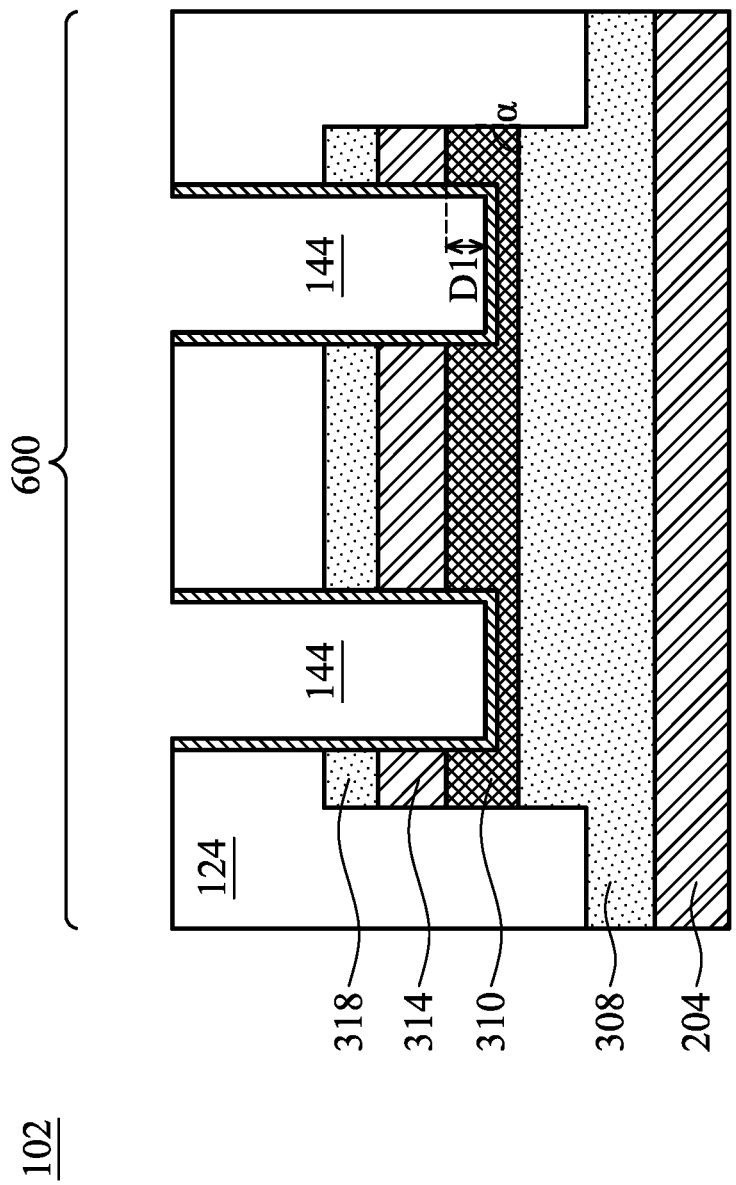

FIGS. 7A and 7B follow from FIGS. 6A and 6B, respectively, and illustrate a seed layer or barrier layer 348 formed on exposed surfaces of the via openings 144 and 244, the trench openings 140 and 240, the bottom mask 328, and the top mask 132. The barrier layer 348 may be a conductive diffusion barrier liner comprising Ti or TiN and may have a thickness in a range of about 30 Å to about 50 Å. The materials used in forming the barrier layer 348 may be deposited by any suitable method, e.g., CVD, PECVD, PVD, ALD, PEALD, electrochemical plating (ECP), electroless plating and/or the like.

Figure 8A:
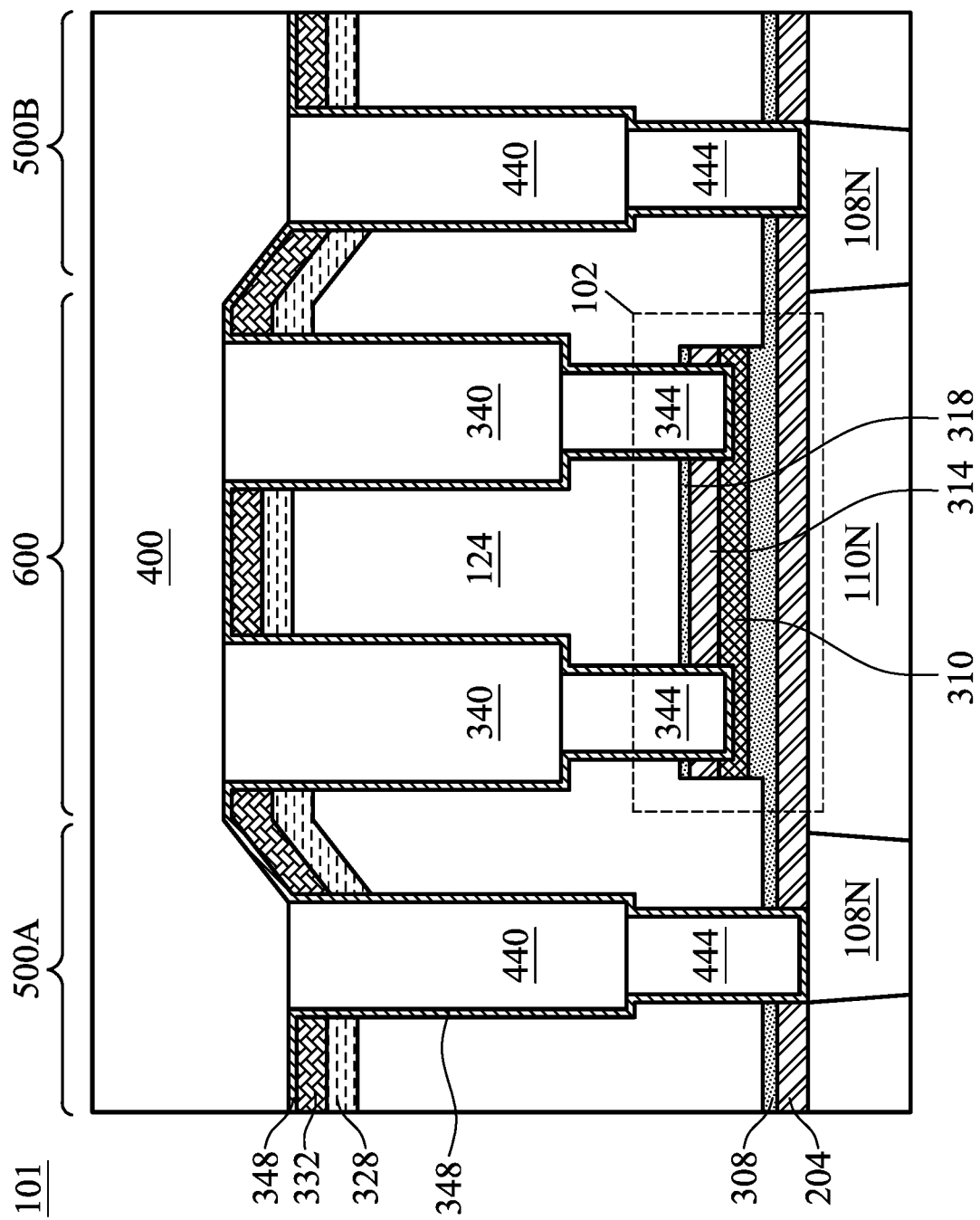
Figure 8B:
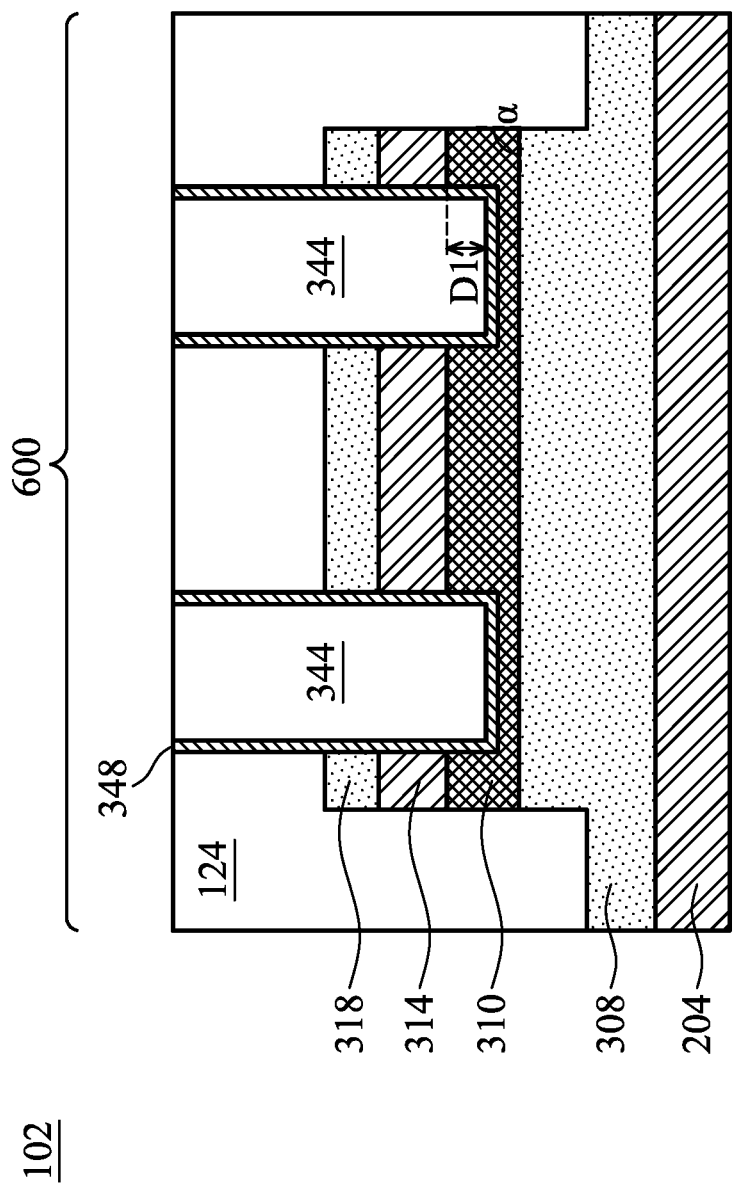

FIGS. 8A and 8B follow from FIGS. 7A and 7B, respectively, illustrating a conductive fill material 400 over the barrier layer 348. In the logic areas 500A and 500B, the conductive fill material 400 in conjunction with the barrier layer 348 forms conductive lines 440 in trench openings 240 and conductive vias 444 in via openings 244. The conductive vias 444 may contact top surfaces of the conductive lines 108N. In the high resistance area 600, the conductive fill material 400 in conjunction with the barrier layer 348 forms conductive lines 340 in trench openings 140 and conductive vias 344 in via openings 144. In some embodiments, the materials and processing techniques used to form the conductive vias 344 and 444 and the conductive lines 340 and 440 may be the same as those used to form vias and lines at the interconnect levels described above (e.g., 104A and 108A). Because the via openings 144 and 244 are formed to have substantially similar bottom surface areas, the conductive vias 344 and 444 may have substantially similar resistances due to being formed in via openings 144 and 244, respectively, which may have substantially similar bottom surface areas as described above with respect to FIGS. 6A and 6B. This uniformity in contact resistance of the conductive vias 344 and 444 may be useful for device performance. Additionally, the via openings 144 and 244 are formed before a top surface of the low-k dielectric layer 124 is planarized by a process such as, e.g., a CMP, as described below with respect to FIG. 9A. The thickness of the low-k dielectric layer 124 in the logic areas 500A and 500B will be substantially similar to the thickness of the low-k dielectric layer 124 in the high resistance area 600 during the formation of the via openings 144 and 244, which may be useful in achieving substantially similar bottom surface areas of the via openings 144 and 244.

Figure 9A:
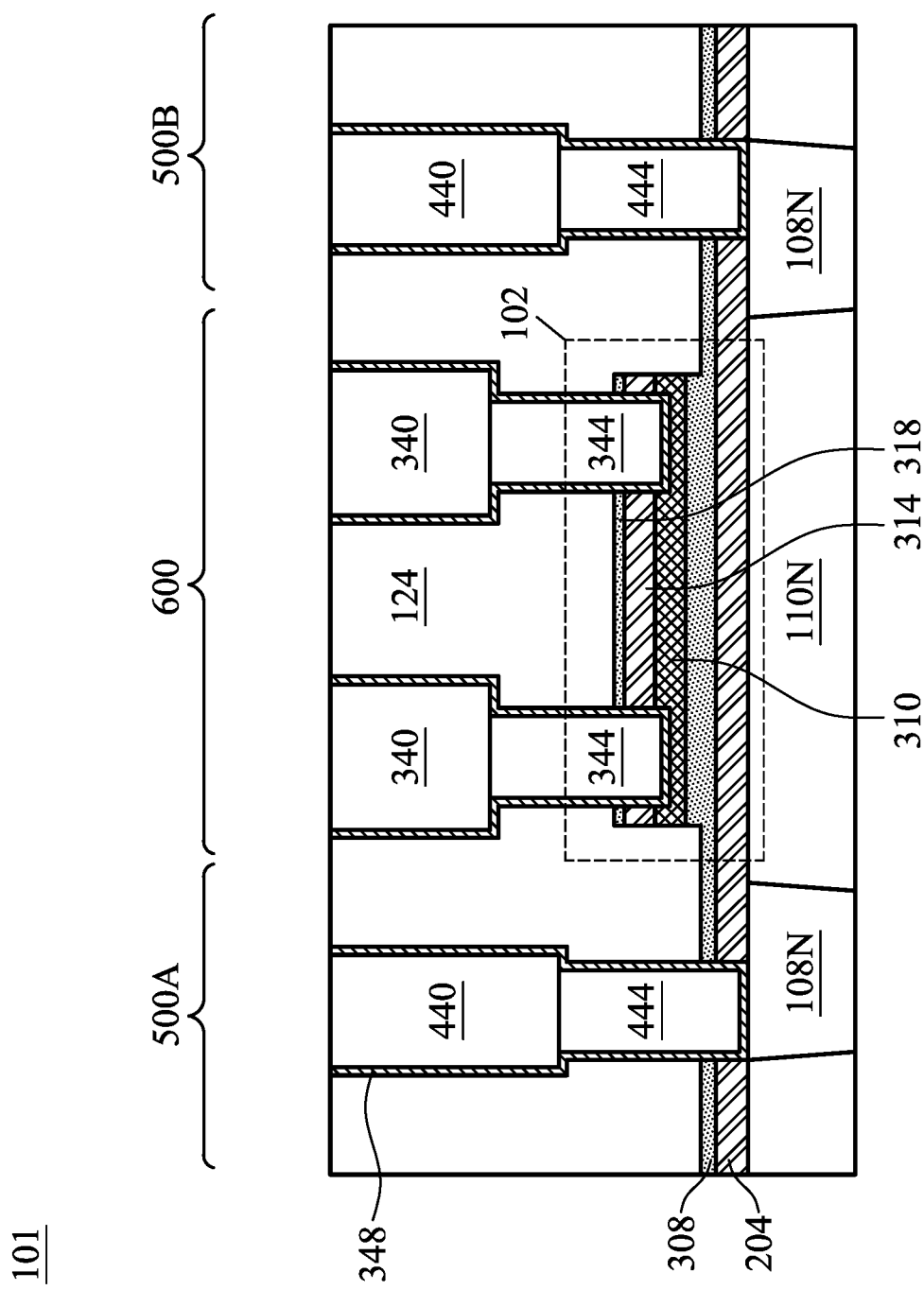

FIG. 9A illustrates the removal of top portions of the conductive fill material 400, top portions of the low-k dielectric layer 124, top portions of the barrier layer 348, the bottom mask 328, and the top mask 332. A planarizing process, e.g. a CMP, may be performed to form top surfaces of the low-k dielectric layer 124 and the conductive lines 340 and 440 that are substantially planar. Subsequent interconnect levels may be formed on the top surfaces of the low-k dielectric layer 124 and the conductive lines 340 and 440.

Figure 9B:
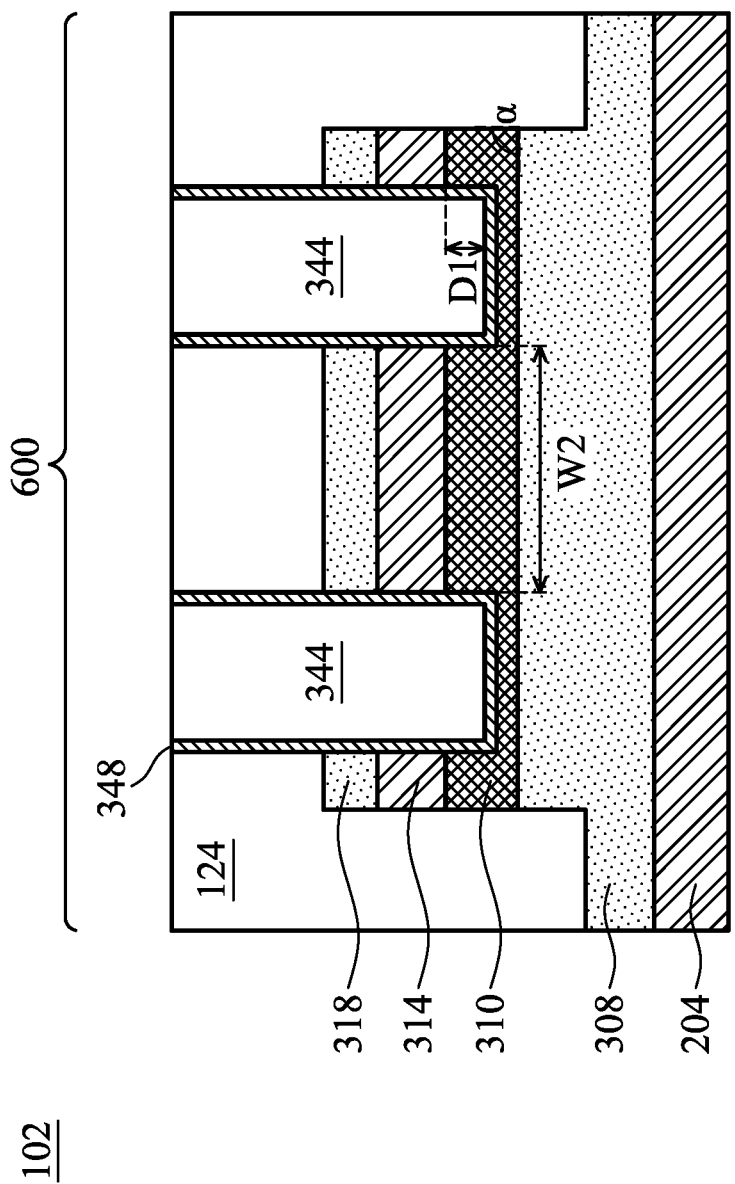

FIG. 9B illustrates a detailed view of region 102 of FIG. 9A. The high resistance area 600 comprises two conductive vias 344 extending into the patterned high resistance layer 310. The two conductive vias 344 may be separated by a width W2 in a range of about 1000 Å to about 10000 Å. An electrical connection between the two conductive vias 344 through the patterned high resistance layer 310 may have a resistance in a range of about 500 ohm/sq to about 900 ohm/sq. Forming connections through the patterned high resistance layer 310 in the high resistance area 600 may save up to 5% of an analog circuit design area in comparison with designs where an equivalent connection through a resistor is formed below the metallization layers.

Figure 10A:
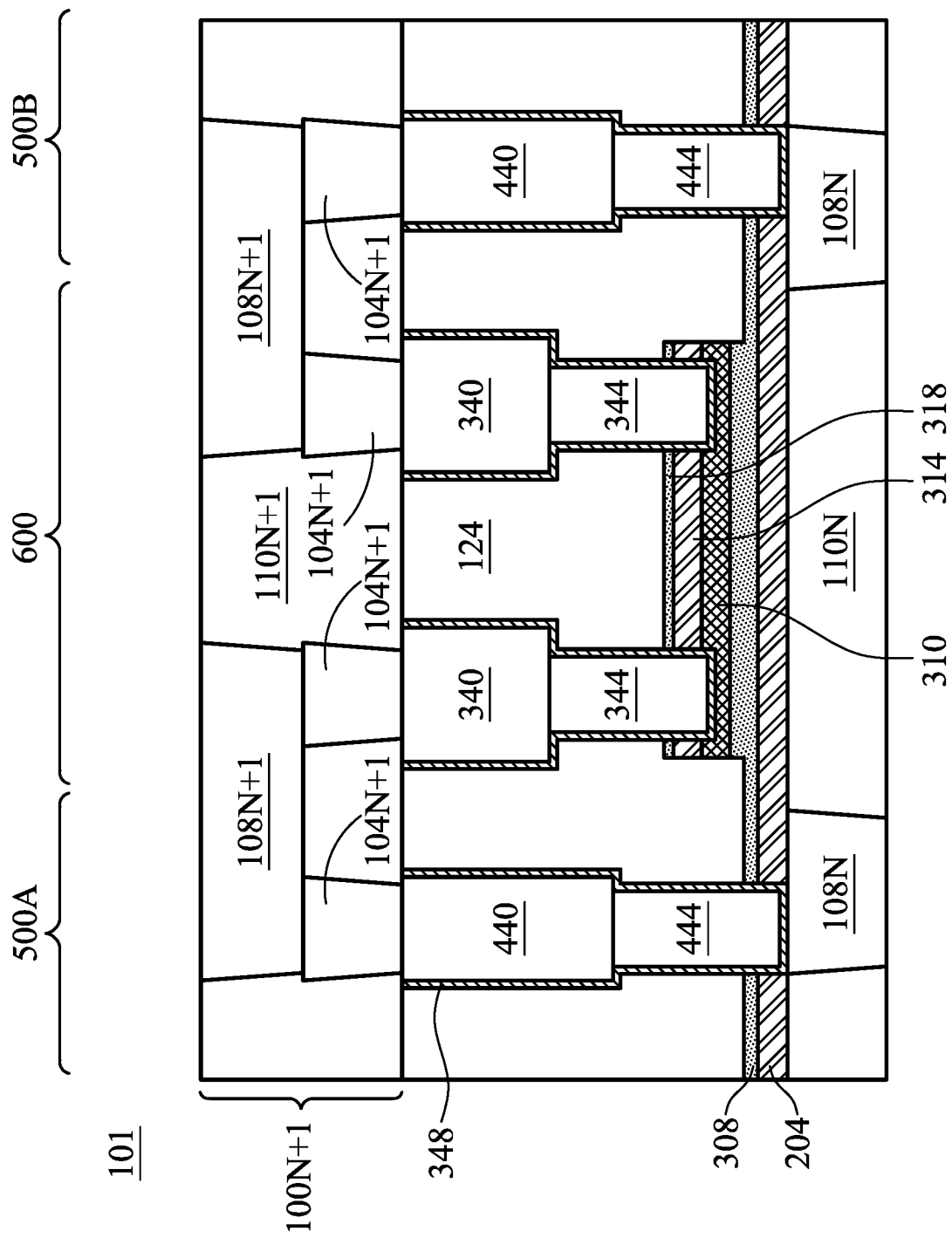

FIG. 10A follows from FIG. 9A, illustrating an $N+1^{st}$ interconnect level 100N+1 over the low-k dielectric layer 124 and the conductive lines 340 and 440. In some embodiments, the structure of the $N+1^{st}$ interconnect level 100N+1 may be similar to other interconnect levels (e.g., the first interconnect level 100A and the 100B). In the example illustrated in FIG. 10A, the $N+1^{st}$ interconnect level 100N+1 comprises conductive vias 104N+1 and conductive lines 108N+1 embedded in an insulating film IMD 110N+1 having a planar top surface. The materials and processing techniques described above in the context of the first interconnect level 100A and subsequent interconnect levels may be used to form the $N+1^{st}$ interconnect level 100N+1.

In some embodiments, as illustrated by FIG. 10A, the conductive vias 104N+1 and conductive lines 108N+1 form an electrical connection between the conductive lines 108N in the N$^{th}$ interconnect level through the patterned high resistance layer 310. This electrical connection may further extend to electrically couple the patterned high resistance layer 310 to gate electrodes, source/drain regions, capacitors, other resistors, other circuitry, and/or the like. For example, in some embodiments, the electrical connection may electrically connect a gate electrode 64 (e.g., a replacement conductive gate layer as illustrated in FIG. 1) of a transistor such as a FinFET device 60 (see FIG. 1) to a voltage source (not illustrated) through the patterned high resistance layer 310. Forming an electrical connection between the gate electrode 64 of the transistor and the voltage source of a second transistor may be useful for current limiting to reduce potential damage to the transistor. Electrical connections may also be formed through the patterned high resistance layer 310 which may be useful for forming, for example, a voltage divider. A voltage divider is a circuit which converts a large voltage into a smaller one. Using two series resistors and an input voltage, an output voltage that is a fraction of the input voltage may be created.

Figure 10B:
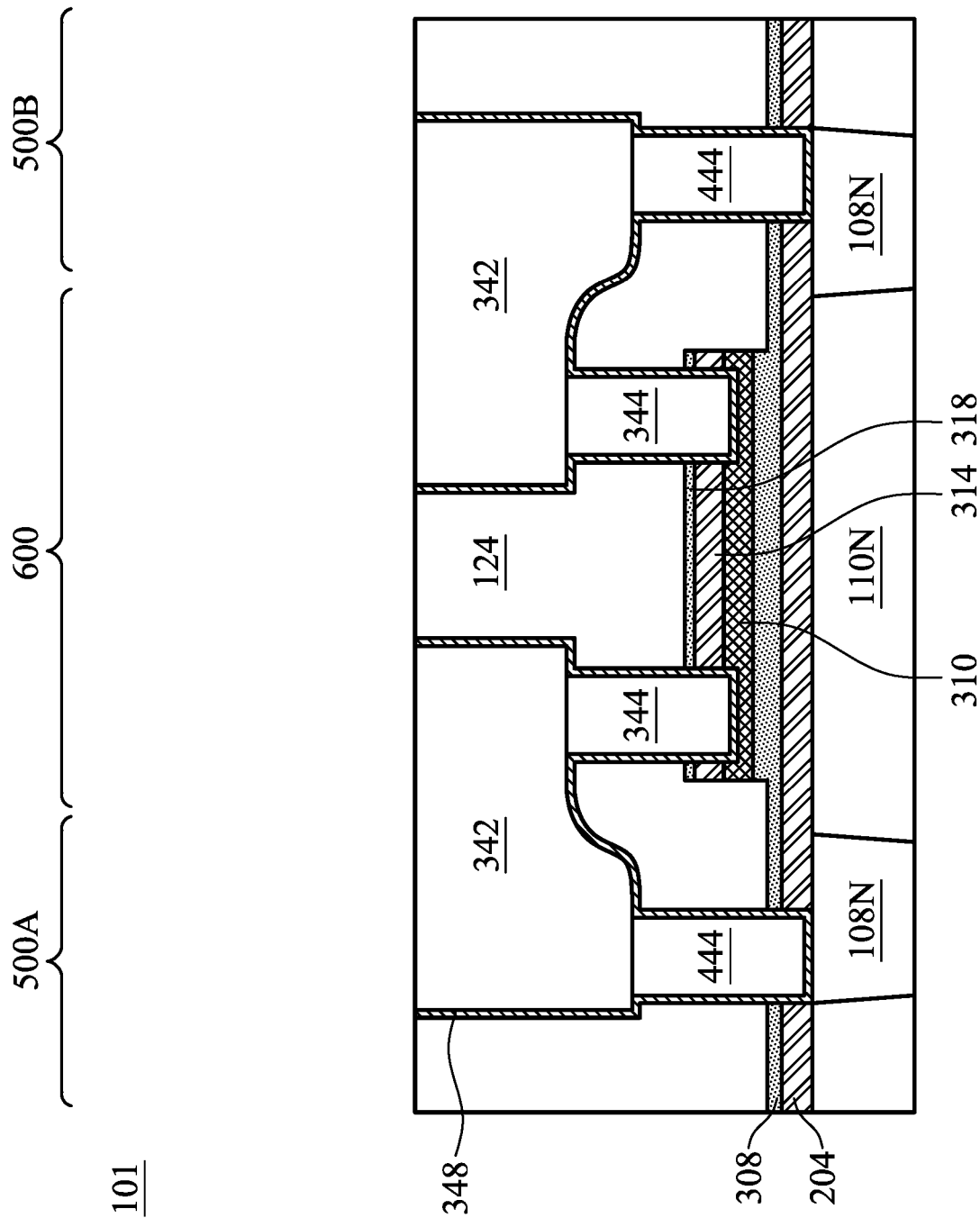

FIG. 10B illustrates the conductive vias 344 and 444 being physically and electrically connected by conductive lines 342, in accordance with some embodiments. The conductive lines 342 may be formed by similar processes as the conductive lines 340 and 440 as illustrated in FIG. 9A, wherein the trench openings 240 and 140 (see FIG. 7A) are formed to be a single continuous trench connecting the via openings 144 and 244 (see FIG. 7A). The conductive lines 342 form an electrical connection between the conductive lines 108N in the N$^{th}$ interconnect level through the patterned high resistance layer 310. This electrical connection may further extend, for example, to electrically connect a gate electrode, source/drain regions, capacitors, other circuitry or the like, similar to that discussed above.

The above disclosure may provide advantages. Placing the electrical connection through the patterned high resistance layer 310 in the BEOL area between metallization layers over circuitry such as transistors and/or resistors may save, for example, up to 5% of an analog circuit design area over designs wherein the high resistance layer is below the metallization layers, such as in the Middle End Of Line (MEOL) area or the Front End Of Line (FEOL), and occupies around 5% of the analog die area. While the present disclosure discusses forming an electrical connection through a patterned high resistance layer 310 in the context of examples of electrical connections between conductive lines 108N+1 in the N$^{th}$ interconnect level as illustrated in FIG. 10A, other embodiments may utilize aspects of this disclosure for other configurations of electrical connections.

Additionally, using similar dielectric layers over and below the high resistance layer may be useful for controlling the bottom surface areas of conductive vias to be substantially similar, leading to uniform contact resistance in conductive vias that may be useful for device performance.

In accordance with an embodiment, a semiconductor structure includes: a first dielectric layer over a first conductive line and a second conductive line; a high resistance layer over a first portion of the first dielectric layer, a second portion of the first dielectric layer being free of the high resistance layer, the first portion of the first dielectric layer having a first thickness, the second portion of the first dielectric layer having a second thickness less than the first thickness; a second dielectric layer on the high resistance layer; a low-k dielectric layer over the second dielectric layer and the second portion of the first dielectric layer, the low-k dielectric layer extending along sidewalls of the high resistance layer and the second dielectric layer; a first conductive via extending through the low-k dielectric layer and the second dielectric layer, the first conductive via extending into the high resistance layer; and a second conductive via extending through the low-k dielectric layer and the first dielectric layer to the first conductive line. In an embodiment, a thickness of the second dielectric layer is substantially similar to the second thickness of the first dielectric layer. In an embodiment, the first conductive via extends into the high resistance layer to a depth in a range of 10 Å to 40 Å. In an embodiment, the high resistance layer includes TiN or TaN. In an embodiment, the structure further includes a third conductive line, wherein the third conductive line is electrically interposed between the first conductive via and the second conductive via. In an embodiment, the second dielectric layer includes a silicidation blocking layer (SBL) and a dielectric sublayer over the SBL. In an embodiment, the dielectric sublayer includes SiO$_2$ and the SBL includes SiC. In an embodiment, the dielectric sublayer has a thickness in a range of 80 Å to 150 Å and the SBL has a thickness in a range of 80 Å to 150 Å.

In accordance with another embodiment, a semiconductor structure includes: a logic area, including a first conductive line, a first portion of a first dielectric layer over the first conductive line, the first portion having a first thickness, a first portion of a low-k dielectric layer over the first dielectric layer, and a first conductive via extending through the first portion of the low-k dielectric layer and the first dielectric layer, the first conductive via physically contacting the first conductive line; and a high resistance area, the high resistance area including a second portion of the first dielectric layer; a high resistance layer on the second portion of the first dielectric layer; a second dielectric layer on the high resistance layer, the second dielectric layer having a second thickness, wherein the second dielectric layer has a same material structure as the first portion of the first dielectric layer over the first conductive line; a second portion of the low-k dielectric layer on the second dielectric layer; and a second conductive via extending through the second portion of the low-k dielectric layer and the second dielectric layer, the second conductive via extending below a top surface of the high resistance layer. In an embodiment, the first portion of the first dielectric layer includes a first silicidation blocking layer (SBL) and a first dielectric sublayer over the first SBL, and the second dielectric layer includes a second SBL and a second dielectric sublayer over the second SBL. In an embodiment, the first SBL and the second SBL include a first same material, wherein the first dielectric sublayer and the second dielectric sublayer include a second same material. In an embodiment, the first dielectric sublayer and the second dielectric sublayer have a third thickness, wherein the first SBL and the second SBL have a fourth thickness. In an embodiment, the third thickness is in a range of 150 to 250 Å and the fourth thickness is in a range of 150 to 250 Å. In an embodiment, a ratio of the first thickness to the second thickness is in a range of 0.9 to 1.1.

In accordance with yet another embodiment, a method of forming a semiconductor structure includes: forming a first dielectric layer over an interconnect layer, the interconnect layer including a conductive line; forming a high resistance layer on the first dielectric layer; forming a second dielectric layer on the high resistance layer; patterning the second dielectric layer and the high resistance layer, wherein the patterning recesses the first dielectric layer over the conductive line, wherein after patterning the first dielectric layer over the conductive line has a first thickness, wherein the first dielectric layer under the high resistance layer has a second thickness greater than the first thickness; forming a low-k dielectric layer over the second dielectric layer and the first dielectric layer, the low-k dielectric layer extending over a top surface and a sidewall of the first dielectric layer; forming a first opening through the low-k dielectric layer and the second dielectric layer, the first opening extending into the high resistance layer; forming a conductive material in the first opening; and planarizing the low-k dielectric layer and the conductive material. In an embodiment, a ratio of the second thickness to the first thickness is in a range of 0.9 to 1.1. In an embodiment, forming the first dielectric layer includes forming a first dielectric sublayer and a second dielectric sublayer over the first dielectric sublayer, wherein forming the second dielectric layer includes forming a third dielectric sublayer and a fourth dielectric sublayer over the third dielectric sublayer, wherein the first dielectric sublayer has a substantially same thickness as the third dielectric sublayer, wherein the second dielectric sublayer is thicker than the fourth dielectric sublayer. In an embodiment, the method further includes forming a second opening through the low-k dielectric layer and the first dielectric layer, the first dielectric layer being in physical contact with the low-k dielectric layer, wherein forming the conductive material includes forming the conductive material in the second opening. In an embodiment, the forming the first opening and the forming the second opening are performed at the same time. In an embodiment, the method further includes forming a trench in the low-k dielectric layer, wherein the trench extends from the first opening to the second opening, wherein forming the conductive material includes forming the conductive material in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
    forming a first interconnect layer over a transistor;
    forming a second interconnect layer over the first interconnect layer;
    forming a third interconnect layer over the second interconnect layer;
    forming a fourth interconnect layer over the third interconnect layer, the fourth interconnect layer comprising a conductive line;
    forming a first dielectric layer over the fourth interconnect layer;
    forming a high resistance layer on the first dielectric layer;
    forming a second dielectric layer on the high resistance layer, the first dielectric layer and the second dielectric layer having a same composition;
    patterning the second dielectric layer and the high resistance layer, wherein the patterning recesses the first dielectric layer over the conductive line, wherein after patterning the second dielectric layer;
        the first dielectric layer has a first thickness over the conductive line;
        the first dielectric layer has a second thickness under the high resistance layer, wherein the second thickness is greater than the first thickness; and
        the second dielectric layer has a third thickness, wherein the third thickness is equal to the first thickness;
    forming a low-k dielectric layer over the second dielectric layer and the first dielectric layer, the low-k dielectric layer extending over a top surface and a sidewall of the first dielectric layer;
    forming a first opening through the low-k dielectric layer and the second dielectric layer, the first opening extending into the high resistance layer;
    forming a second opening through the low-k dielectric layer and the first dielectric layer, forming the first opening and forming the second opening being performed simultaneously, wherein the first opening and the second opening have same bottom surface areas;
    forming a conductive material in the first opening and the second opening; and
    planarizing the low-k dielectric layer and the conductive material.

2. The method of claim 1, wherein forming the first dielectric layer comprises forming a first dielectric sublayer and a second dielectric sublayer over the first dielectric sublayer, wherein forming the second dielectric layer comprises forming a third dielectric sublayer and a fourth dielectric sublayer over the third dielectric sublayer, wherein the first dielectric sublayer has a substantially same thickness as the third dielectric sublayer, wherein the second dielectric sublayer is thicker than the fourth dielectric sublayer.

3. The method of claim 1 further comprising:
    forming a second opening through the low-k dielectric layer and the first dielectric layer, the first dielectric layer being in physical contact with the low-k dielectric layer, wherein forming the conductive material comprises forming the conductive material in the second opening.

4. The method of claim 3, wherein the conductive material in the first opening and the second opening have same contact resistances on bottom surfaces.

5. A method of forming a semiconductor structure, the method comprising:
    forming a high resistance layer over a first dielectric layer, the first dielectric layer being over a first conductive line, the first dielectric layer having a first thickness;
    depositing a second dielectric layer over the high resistance layer, the second dielectric layer having a second thickness;
    patterning the first dielectric layer, the second dielectric layer, and the high resistance layer, wherein patterning the high resistance layer removes a portion of the high resistance layer over the first conductive line, wherein, after patterning, the first dielectric layer has a third thickness over the first conductive line and the second dielectric layer has a fourth thickness, wherein the third thickness is less than the first thickness, wherein the fourth thickness is less than the second thickness, wherein the fourth thickness is substantially the same as the third thickness, and wherein during patterning an etch rate of the second dielectric layer is the same as the etch rate of the first dielectric layer;
    depositing a low-k dielectric layer over the second dielectric layer and the first dielectric layer, the low-k dielectric layer covering sidewalls of the patterned high resistance layer;

forming a first conductive via through the second dielectric layer, the first conductive via extending into the high resistance layer to a depth in a range of 10 Å to 40 Å;

forming a second conductive via through the first dielectric layer, the second conductive via physically contacting the first conductive line; and forming a second conductive line over the second conductive via, wherein a bottom corner of the second conductive line is lower than a top corner of the first conductive via and the bottom corner of the second conductive line is higher than a bottom surface of the first conductive via.

6. The method of claim 5, wherein the high resistance layer comprises TiN or TaN.

7. The method of claim 5, wherein the second conductive line is electrically interconnected between the first conductive via and the second conductive via.

8. The method of claim 5, wherein depositing the second dielectric layer comprises:
    depositing a silicidation blocking layer (SBL); and
    depositing a dielectric sublayer over the SBL.

9. The method of claim 8, wherein the dielectric sublayer comprises $SiO_2$ and the SBL comprises SiC.

10. The method of claim 8, wherein the dielectric sublayer has a thickness in a range of 80 Å to 150 Å and the SBL has a thickness in a range of 80 Å to 150 Å.

11. The method of claim 5, wherein the first conductive via and the second conductive via have same bottom contact resistances.

12. A method of forming a semiconductor structure, the method comprising:
    depositing a first dielectric layer over a first interconnect layer, the first interconnect layer comprising a first conductive line in a logic area;
    forming a high resistance layer over the first dielectric layer, the high resistance layer extending over the logic area and a high resistance area;
    depositing a second dielectric layer over the high resistance layer;
    patterning the second dielectric layer and the high resistance layer using an etching process, the etching process removing a portion of the high resistance layer in the logic area, wherein after the etching process a first portion of the first dielectric layer in the logic area has a first thickness and a second portion of the first dielectric layer in the high resistance area under a remaining portion of the high resistance layer has a second thickness, the first thickness being less than the second thickness, and wherein after the etching process, a remaining portion of the second dielectric layer has a thickness equal to the first thickness of the first dielectric layer;
    depositing a low-k dielectric layer over the second dielectric layer and the first dielectric layer, the low-k dielectric layer extending over the logic area and the high resistance area;
    forming a first conductive via in the logic area through the low-k dielectric layer and the first dielectric layer, the first conductive via physically contacting the first conductive line;
    forming a second conductive via in the high resistance area through the low-k dielectric layer and the second dielectric layer, the second conductive via extending into the remaining portion of the high resistance layer;
    forming a third conductive via in the high resistance area through the low-k dielectric layer and the second dielectric layer, the third conductive via extending into the remaining portion of the high resistance layer, wherein forming the first conductive via, forming the second conductive via, and forming the third conductive via are performed simultaneously, and wherein the first conductive via, the second conductive via, and the third conductive via have same contact resistances; and
    forming a second conductive line in the low-k dielectric layer, the second conductive line physically contacting the first conductive via and the second conductive via, an interface between the second conductive line and the first conductive via being above a bottommost surface of the second conductive via.

13. The method of claim 12, wherein forming the first dielectric layer comprises forming a first silicidation blocking layer (SBL) and forming a first dielectric sublayer over the first SBL, and forming the second dielectric layer comprises forming a second SBL and forming a second dielectric sublayer over the second SBL.

14. The method of claim 13, wherein the first SBL and the second SBL comprise a first same material, wherein the first dielectric sublayer and the second dielectric sublayer comprise a second same material.

15. The method of claim 13, wherein the first dielectric sublayer and the second dielectric sublayer each have a third thickness and wherein the first SBL and the second SBL each have a fourth thickness.

16. The method of claim 15, wherein the fourth thickness is in a range of 80 to 150 Å.

17. The method of claim 13, wherein a ratio of a thickness of the first dielectric sublayer to a thickness of the second dielectric sublayer is in a range of 0.9 to 1.1.

18. The method of claim 12, further comprising forming a second interconnect layer over an active device, forming a third interconnect layer over the second interconnect layer, forming a fourth interconnect layer over the third interconnect layer, and forming the first interconnect layer over the fourth interconnect layer.

19. The method of claim 1, wherein the first opening extends into the high resistance layer to a depth in a range of 10 Å to 40 Å.

20. The method of claim 12, wherein the second conductive via extends into the remaining portion of the high resistance layer to a depth in a range of 10 Å to 40 Å.

* * * * *